United States Patent [19]

Beijer

[11] Patent Number: 5,434,867
[45] Date of Patent: Jul. 18, 1995

[54] AUDIO AMPLIFIER ARRANGEMENT HAVING A VOLUME DEPENDENT TONE CONTROL

[75] Inventor: Paul A. C. Beijer, Eindhoven, Netherlands

[73] Assignee: U.S. Philips Corporation, New York, N.Y.

[21] Appl. No.: 222,758

[22] Filed: Apr. 4, 1994

[30] Foreign Application Priority Data

Apr. 23, 1993 [EP]  European Pat. Off. ............ 93201182

[51] Int. Cl.⁶ .............................................. H03F 3/183
[52] U.S. Cl. .................................. 330/107; 330/294; 330/305; 330/306; 381/102
[58] Field of Search ............... 330/107, 294, 305, 306; 333/28 T; 381/98, 101, 102

[56] References Cited

U.S. PATENT DOCUMENTS

5,046,105  9/1991  Bohn ..................................... 381/98

FOREIGN PATENT DOCUMENTS

61-158205  7/1986  Japan .

*Primary Examiner*—James B. Mullins
*Attorney, Agent, or Firm*—Edward Blocker

[57] ABSTRACT

An audio amplifier having a volume-dependent tone control which is inexpensive and hardly distorts the audio signal. A filter in the signal path of the audio amplifier determines the tone control at low volumes. The bass tones and possibly treble tones are then amplified to a greater extent than the mid-range tones. With an increasing volume, a continuously controllable amplifier stage increasingly compensates this tone control. To this end a linear feedback path is arranged across this amplifier stage, with a pole in or near the frequency range of the bass and mid-range tones.

14 Claims, 2 Drawing Sheets

AUDIO AMPLIFIER ARRANGEMENT HAVING A VOLUME DEPENDENT TONE CONTROL

BACKGROUND OF THE INVENTION

1. Field of the Invention

The invention relates to an audio amplifier arrangement having a volume-dependent tone control and, incorporated in a signal path, a filtering device whose amplitude-frequency response has a low-pass slope in the frequency range between the bass and mid-range tones, and an amplifier stage incorporated in the signal path, while a feedback path extends from an output to an input of the amplifier stage.

2. Description of the Prior Art

Such an arrangement is known per se from Japanese Patent publication Kokai 61-158205. It may be incorporated, for example in a television or radio apparatus, a portable compact disc player or a "walkman" and may be denoted by the term "dynamic bass boost". It maintains the perceptual sound quality throughout the volume range by amplifying bass tones up to the order of 400 Hz and possibly treble tones from an order of 4 kHz at a low volume to a larger extent than mid-range tones which are between said frequency ranges.

FIG. 1 shows the known arrangement. A filtering device 2 is coupled to an amplifier 3 which in its rum is coupled to a loudspeaker 4 and to a detection device 5. The amplitude-frequency response of the filtering device 2 is switchable by means of a switching signal Sd between substantially two fixed characteristics. The output of the detection device 5 supplies the switching signal Sd which depends on the amplitude of the output signal of the amplifier 3 applied to the loudspeaker 4.

If the afore-mentioned amplitude exceeds a predetermined value, the switching signal Sd adjusts the filtering device 2 in such a way that it exhibits a substantially flat amplitude-frequency response. In this condition the known arrangement amplifies all tones to an equal extent. If the amplitude falls below the predetermined value, the switching signal Sd adjusts the filtering device 2 in such a way that it has an amplitude-frequency response at which mid-range tones are attenuated. In this condition the known arrangement amplifies both the bass tones and the treble tones to a relatively greater extent.

The known arrangement has a plurality of considerable shortcomings.

First, a relatively large number of components is required for realising the volume-dependent tone control. In practice, notably detection device 5 will often comprise a larger number of more expensive components than that shown in the embodiment in the afore-mentioned Patent publication. The relatively high cost price of the known arrangement renders it less suitable for use in low-cost consumer electronics.

Secondly, the tone control is adjusted in steps to the volume. The amplitude-frequency response of the known arrangement has only two characteristics. The deviation from an optimal characteristic associated with each volume may thus be relatively large. Moreover, a small variation of volume may result in abrupt transition from the one to the other amplitude-frequency response. This detracts from a high fidelity sound reproduction. Disturbing sound effects may occur, particularly when the volume fluctuates, instantaneously or not instantaneously, around this transition range.

Thirdly, a compromise must be found in the known arrangement between the rate at which the switching signal Sd responds to a change of volume on the one hand and the suppression of distorted audio signals in this switching signal on the other hand. If the afore-mentioned rate is too slow, the tone control will audibly trail the volume. If the afore-mentioned suppression is insufficient, the output signal of the known arrangement may be considerably distorted. Distorted audio signals in the switching signal may reach the output signal of the known arrangement either directly, or via mixing.

The compromise is inherent in the known facts: distorted audio signals are produced in the non-linear feedback path from the output to the input of the amplifier stage. By suppressing these audio signals, the reaction speed of the control signal decreases. Thus, the known arrangement cannot supply an output signal which is free from both additional distortion and disturbing sound effects.

SUMMARY OF THE INVENTION

It is an object of the invention to provide an amplifier arrangement of the type described in the opening paragraph which can be realised at relatively low cost, adapts its amplitude-frequency response steplessly to the volume and yields an improved sound reproduction.

According to the invention, such an arrangement is therefore characterized in that the gain of the amplifier stage is continuously controllable and in that the feedback path has a substantially linear transfer with a pole in or near the frequency range mentioned in the opening paragraph.

The invention is based on the recognition that the amplifier stage itself compensates the tone control by the filtering device upon an increasing gain so that the amplifier arrangement as a whole will exhibit a substantially flat amplitude-frequency response.

At a low gain factor the presence of a feedback path has little influence on the transfer of the amplifier stage: its amplitude-frequency response is then substantially flat. Under this condition the filtering device substantially determines the tone control. However, at a high gain factor the linear feedback path determines the transfer of the amplifier stage to a considerable extent. For a substantially flat amplitude-frequency response of the amplifier arrangement, the amplitude-frequency response of the amplifier stage should be substantially inverse to that of the filtering device. To this end the feedback path transfer has a pole in or near the frequency range mentioned in the opening paragraph.

Since the gain of the amplifier stage is continuously controllable, the amplitude-frequency response changes steplessly with the adjusted volume. A suitable dimensioning of the amplifier stage and the feedback path reduces the deviation of this response, with an optimum characteristic associated with each volume.

The substantially linear feedback path ensuring the volume dependence of the tone control hardly introduces distortion. Moreover, the tone control does not continuously adapt itself as a function of a signal amplitude. Consequently, disturbing sound effects can be avoided. The amplitude-frequency response only changes when the volume setting is changed. The invention utilizes the fact that the average amplitude of the input signal of the amplifier arrangement is reasonably constant. Consequently, the volume setting is a sufficiently reliable measure of the real volume.

The cost of an amplifier arrangement according to the invention is relatively low. The feedback path may comprise a small number of low-cost passive components. This has removed a barrier of providing low-priced apparatuses such as, for example small-screen colour television apparatuses with a volume-dependent tone control.

A first preferred embodiment of the invention is characterized in that the feedback path and the amplifier stage constitute a negative feedback loop and in that the amplitude-frequency response of the feedback path has a low-pass slope. A negative feedback loop provides the advantage that the distortion by the amplifier stage further decreases. The low-pass slope causes the gain of the amplifier stage to decrease, particularly in the case of tones which are within the passbands of the filtering device.

A second preferred embodiment of the invention is characterized in that the feedback path and the amplifier stage constitute a positive feedback loop and in that the amplitude-frequency response of the feedback path has a high-pass slope. A positive feedback loop provides the advantage that the maximum gain factor of the amplifier arrangement is larger than in the case of a negative feedback loop. The high-pass slope causes the gain of the amplifier stage to increase, particularly in the case of tones which are outside the passbands of the filtering device. In essence, this is the dual case of negative feedback.

This embodiment is based on the recognition that the drawbacks, usually associated with a positive feedback such as distortion and oscillations do not play an important role in this respect. A positive feedback generally reduces the linearity and stability of an amplifier stage to the extent to which it increases the gain. Only a slight increase of gain is necessary for the invention so as to compensate for attenuation by the filtering device. Moreover, the amplifier stage across which the feedback path is arranged is generally already linear to such an extent that a small reduction of linearity is insignificant.

In many cases the amplifier stage includes a negative feedback. If the loop gain in the positive feedback loop remains smaller than one, the positive feedback only partly eliminates the effect of this negative feedback. Thus, a negative feedback subsists, which may ensure a sufficiently low distortion and at which oscillation need not occur.

A further preferred embodiment is characterized in that a series-arranged resistor and a capacitor are incorporated in the feedback path. With these elements in the feedback path, the amplifier stage can compensate for the low-pass character of the filtering device to a considerable extent at a high volume. The capacitor blocks the bass tones so that the gain of the amplifier stage for these tones is smaller than for mid-range and treble tones. The series resistor ensures that the loop gain in the positive feedback loop does not continue to increase with increasing frequencies.

A further preferred embodiment is characterized in that the filtering device mentioned in the opening paragraph precedes the amplifier stage. It is thereby ensured that the distortion in the amplifier arrangement according to the invention is maintained as small as possible. When an input signal of an amplifier is attenuated, distortion components in an output signal decrease with respect to the undistorted output signal. The embodiment provides substantially the same distortion as in the case where the amplifier arrangement would have had no filtering device and no feedback path.

A further preferred embodiment of the invention is characterized in that the output of the filtering device is coupled to the input of the amplifier stage. This is a simple embodiment in which no buffer stage is incorporated between the filtering device and the input of the amplifier stage. Moreover, there may be an economy of components in the feedback path by making use of the complex output impedance of the filtering device which also determines the loop gain in the positive feedback loop.

A further preferred embodiment is characterized in that the filtering device mentioned in the opening paragraph comprises at least a first resistor which is arranged between the input and the output of the filtering device, a second resistor, a first terminal of which is coupled to the afore-mentioned output and a second terminal of which is connected to a first terminal of a capacitor, a second terminal of said capacitor being coupled to ground, a third resistor which is arranged between the junction of the second resistor and the capacitor and a first terminal of a switching element, a fourth resistor which is arranged between the input and the first terminal of the switching element, a second terminal of the switching element being coupled to ground.

The filming device described in this preferred embodiment enables the user to influence the amplitude-frequency response by operating the switching element. When the switching element is non-conducting, the low-pass slope extends through a larger frequency range than when it is conducting. This embodiment provides the advantage that when operating the switching element, the low-pass slope symmetrically extends or shrinks, respectively.

These and other aspects of the invention will be apparent from and elucidated with reference to the embodiments described hereinafter.

DETAILED DESCRIPTION OF THE PREFERRED EMBODIMENTS

The invention will be further described with reference to FIGS. 2 and 3. The previously mentioned embodiments can be recognized in the embodiment of FIG. 3.

Figure 1:
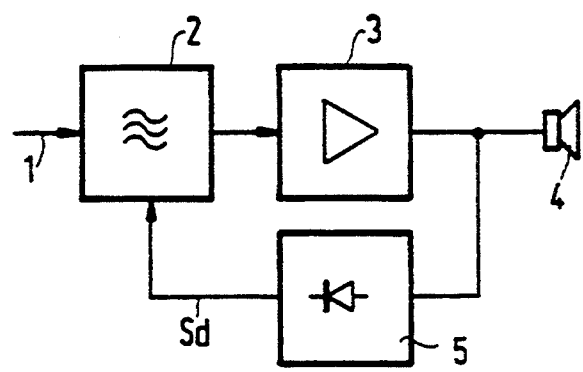
FIG. 1 shows the known arrangement.
Figure 2:
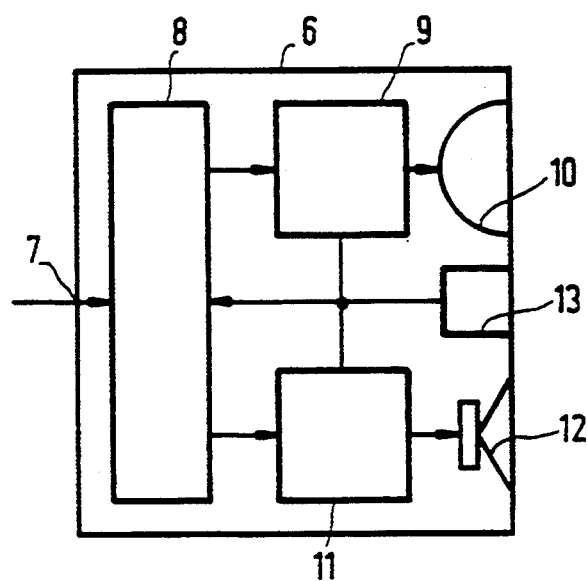
FIG. 2 shows an example of a television apparatus including an arrangement according to the invention.

FIG. 2 shows a television apparatus 6 including an audio amplifier arrangement 11 according to the invention. The television apparatus 6 includes means 8 for obtaining a baseband video and audio signal from a modulated carrier selected for this purpose, which carrier is applied to an input 7. The means 8 are further coupled to two different devices, viz. to a video signal amplifier 9 for controlling a display tube 10 and to the audio amplifier arrangement 11 for controlling a loudspeaker 12. The transfer of the audio amplifier arrangement 11 is also adjustable by means of an operating unit 13. The operating unit 13 may be, for example a receiver for signals from a remote control unit which supplies control signals to the means 8 and the devices 9 and 11.

Figure 3:
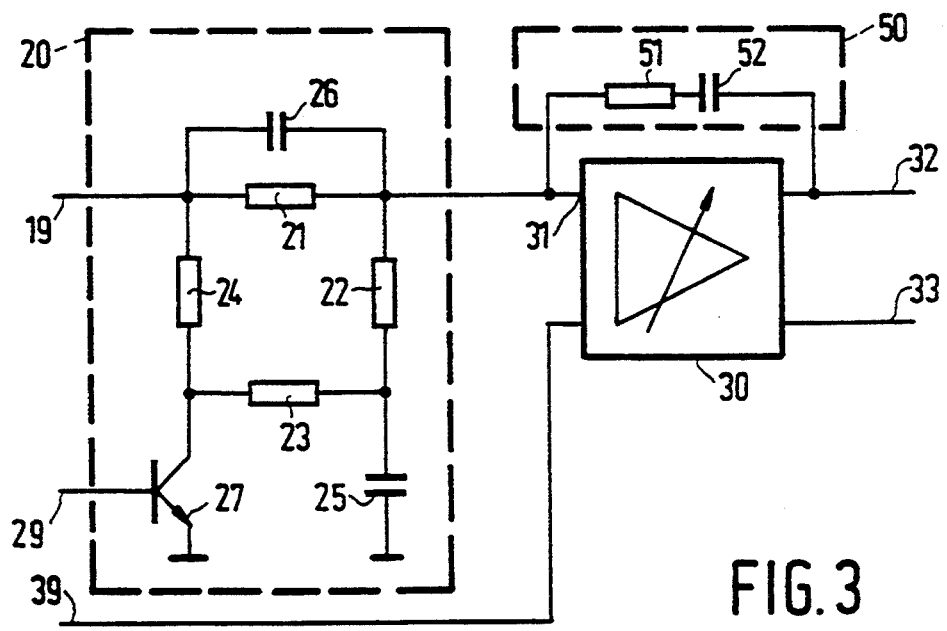
FIG. 3 shows an embodiment of an arrangement according to the invention.

FIG. 3 shows an embodiment of the audio amplifier arrangement 11. In this arrangement components which are not important for understanding the invention, such as, for example DC bias components are omitted.

The afore-mentioned baseband audio signal originating from the means 8 is applied to an input terminal 19. The signal path successively incorporates a filtering device 20 and an amplifier stage 30, with output terminals 32 and 33. The loudspeaker 12 is coupled to these output terminals between which the amplifier stage 30 supplies a bipolar output signal.

The gain factor of the amplifier stage 30 is continuously controllable by means of a voltage applied to the terminal 39. The amplifier stage 30 may be, for example an integrated circuit of the type "TDA7056A". The low-pass slope of the filtering device 20 is adjustable by means of a control signal at the terminal 29, which signal may be derived from a "loudness" or "bass-boost" key on a remote control unit. The signals at the terminals 29 and 39 originate from the operating unit 13.

FIG. 3 also shows an embodiment of the filtering device 20. Dependent on the control signal at the terminal 29, a transistor 27 is turned on or off. If the transistor 27 is turned on, resistors 21, 22, 23 and a capacitor 25 determine the location and length of the low-pass slope. If transistor 27 is turned off, a resistor 24 also influences these characteristics because the current flowing through the resistor 24 contributes to the output signal.

The values of the resistors 21, 22, 23, 24 and the capacitor 25 may be, for example 6.8 kOhm, 1.8 kOhm, 1.8 kOhm and 3.3 kOhm and 220 nano-Farad, respectively. The low-pass slope then extends from approximately 500 Hz to 800 Hz, if the transistor 27 is turned on, and from 200 Hz to 1.1 kHz, if the transistor 27 is turned off. The longer low-pass slope overlaps the shorter low-pass slope.

In the mid-tone frequency range, the capacitor 25 has a small impedance with respect to that of the resistors 21, 22, 23 and 24. The capacitor 25 then behaves substantially as a short circuit. In the afore-mentioned frequency range the transfer of the filtering device 20 is substantially determined by the voltage division across the resistors 21 and 22. The filtering device 20 suppresses the mid-range tones by approximately −14 dB at the above-mentioned component values.

In the bass-tone frequency range the capacitor 25 substantially behaves as an open connection. The transfer of the filtering device 20 then also depends on the state of the transistor 27. If the transistor 27 is turned off, the filtering device 20 will not attenuate the bass tones: 0 dB suppression. If the transistor 27 is turned on, the transfer is substantially equal to the voltage division across the resistor 21 and the series-arranged resistors 22 and 23. The filtering device 20 suppresses the mid-range tones by approximately −9 dB at the above-mentioned component values.

A capacitor 26 may be added to reduce the attenuation of treble tones by the afore-mentioned voltage divisions. This capacitor may have a value of, for example 5.6 nano-Farad.

There is a linear feedback path 50 from the output terminal 32 to an input terminal 31 of the amplifier stage 30. The feedback path 50 and the amplifier stage 30 constitute a positive feedback loop because the transfer from the input terminal 31 to the output terminal 32 is non-inverting. The feedback path 50 may comprise, for example a series-arranged resistor 51 of 68 kOhm and a capacitor 52 of 3.3 nano-Farad. The transfer of the feedback path 50 then has a pole at approximately 700 Hz which is within the frequency range of the low-pass slope of the filtering device 20. For frequencies which are much lower than 700 Hz, the amplitude-frequency response of the feedback path 50 has a high-pass slope.

The loop gain in the positive feedback loop is approximately 0.5 at a maximum gain by the amplifier stage 30. At a much smaller maximum loop gain, a feedback path has substantially no influence on the transfer from the input terminal 31 to the output terminal 32. The amplitude-frequency response then remains substantially flat. At a larger maximum loop gain, the distortion may become unacceptably large and unwanted oscillations may occur. In the embodiment of FIG. 3 the filtering device 20 also determines the loop gain. Together with the output impedance of the filtering device, the impedance in the feedback path between the output terminal 32 and the input terminal 31 constitutes a voltage divider in the positive feedback loop.

At a minimum volume setting the loop gain in the positive feedback loop is much smaller than one due to the small gain factor of the amplifier stage 30. At this setting, the feedback path 50 hardly influences the transfer from the input terminal 31 to the output terminal 32: the amplitude-frequency response is substantially flat. The filtering device 20, whose amplitude-frequency response has a low-pass slope, then substantially determines the tone control.

At a control from minimum to maximum volume, the feedback path 50 will gradually have a greater influence on the transfer from the input terminal 31 to the output terminal 32 because the loop gain increases. At a control to a higher volume, the factor by which the audio amplifier arrangement amplifies bass tones and possibly treble tones additionally with respect to the mid-range tones will gradually decrease. When the gain by the amplifier stage 30 approaches its maximum value, the amplitude-frequency response from input terminal 31 to output terminal 32 will become substantially opposite to that of the filtering device 20. The embodiment of the audio amplifier arrangement 11 shown in FIG. 3 thus has a substantially flat amplitude-frequency response at a maximum volume setting.

The invention as herein disclosed will enable those skilled in the art to conceive many alternative embodiments which do not depart from the scope of the invention. For example, a feedback path need not comprise a series-arranged resistor and a capacitor. A transistor stage may be arranged between the afore-mentioned elements in the feedback path.

Figure 4:
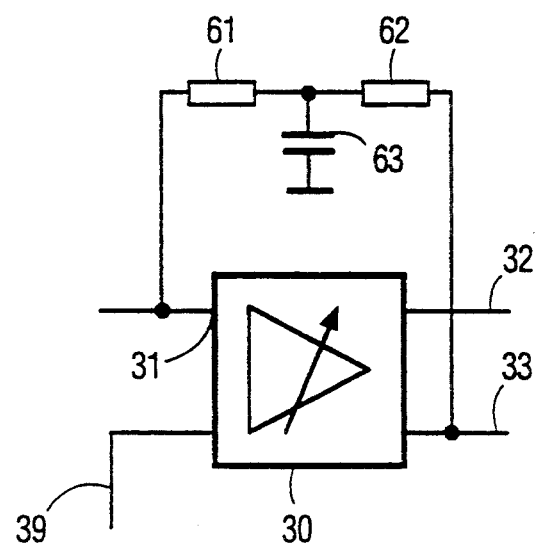
FIG. 4 shows an alternative embodiment of the invention.

The feedback path shown in FIG. 3 may also be incorporated between the output terminal 33 and the input terminal 31 so that a negative feedback loop is obtained as shown in FIG. 4. The amplitude-frequency response of the feedback path then preferably has a low-pass slope. Two series-arranged resistors 61 and 62, with a capacitor 63 between the junction and ground are examples of such a feedback path.

In contrast to what is shown in FIG. 3, the amplifier stage in the signal path may precede the filtering device. Alternatively, those skilled in the art will be able to conceive many modifications of the embodiment of the filming device 20 shown in FIG. 3. The filtering device may comprise a passive or an active filter which is either or not switchable or controllable.

The component values in the embodiment have been given by way of example. The pole position in the feedback path may be adapted arbitrarily. The amplifier stage may comprise one or several transistor stages mounted or not mounted on integrated circuits.

I claim:

1. An audio amplifier arrangement having a volume-dependent tone control and, incorporated in a signal path, a filtering device whose amplitude-frequency response has a low-pass slope in the frequency range between the bass and mid-range tones, and an amplifier stage incorporated in the signal path, while a feedback path extends from an output to an input of the amplifier stage, characterized in that the gain of the amplifier stage is continuously controllable and in that the feedback path has a substantially linear transfer with a pole in or near said frequency range.

2. An audio amplifier arrangement as claimed in claim 1, characterized in that the feedback path and the amplifier stage constitute a positive feedback loop and in that the amplitude-frequency response of the feedback path has a high-pass slope.

3. An audio amplifier arrangement as claimed in claim 2, characterized in that a series-arranged resistor and a capacitor are incorporated in the feedback path.

4. An audio amplifier arrangement as claimed in claim 3, characterized in that said filtering device comprises at least a first resistor which is arranged between the input and the output of the filtering device, a second resistor, a first terminal of which is coupled to said output and a second terminal of which is connected to a first terminal of a capacitor, a second terminal of said capacitor being coupled to ground, a third resistor which is arranged between the junction of the second resistor and the capacitor and a first terminal of a switching element, a fourth resistor which is arranged between the input and the first terminal of the switching element, a second terminal of the switching element being coupled to ground.

5. An audio amplifier arrangement as claimed in claim 2, characterized in that said filtering device in the signal path precedes the amplifier stage.

6. An audio amplifier arrangement as claimed in claim 5, characterized in that said filtering device comprises at least a first resistor which is arranged between the input and the output of the filtering device, a second resistor, a first terminal of which is coupled to said output and a second terminal of which is connected to a first terminal of a capacitor, a second terminal of said capacitor being coupled to ground, a third resistor which is arranged between the junction of the second resistor and the capacitor and a first terminal of a switching element, a fourth resistor which is arranged between the input and the first terminal of the switching element, a second terminal of the switching element being coupled to ground.

7. An audio amplifier arrangement as claimed in claim 2, characterized in that said filtering device comprises at least a first resistor which is arranged between the input and the output of the filtering device, a second resistor, a first terminal of which is coupled to said output and a second terminal of which is connected to a first terminal of a capacitor, a second terminal of said capacitor being coupled to ground, a third resistor which is arranged between the junction of the second resistor and the capacitor and a first terminal of a switching element, a fourth resistor which is arranged between the input and the first terminal of the switching element, a second terminal of the switching element being coupled to ground.

8. An audio amplifier arrangement as claimed in claim 1, characterized in that said filtering device in the signal path precedes the amplifier stage.

9. An audio amplifier arrangement as claimed in claim 8, characterized in that the output of the filtering device is coupled to the input of the amplifier stage.

10. An audio amplifier arrangement as claimed in claim 9, characterized in that said filtering device comprises at least a first resistor which is arranged between the input and the output of the filtering device, a second resistor, a first terminal of which is coupled to said output and a second terminal of which is connected to a first terminal of a capacitor, a second terminal of said capacitor being coupled to ground, a third resistor which is arranged between the junction of the second resistor and the capacitor and a first terminal of a switching element, a fourth resistor which is arranged between the input and the first terminal of the switching element, a second terminal of the switching element being coupled to ground.

11. An audio amplifier arrangement as claimed in claim 8, characterized in that said filtering device comprises at least a first resistor which is arranged between the input and the output of the filtering device, a second resistor, a first terminal of which is coupled to said output and a second terminal of which is connected to a first terminal of a capacitor, a second terminal of said capacitor being coupled to ground, a third resistor which is arranged between the junction of the second resistor and the capacitor and a first terminal of a switching element, a fourth resistor which is arranged between the input and the first terminal of the switching element, a second terminal of the switching element being coupled to ground.

12. An audio amplifier arrangement as claimed in claim 1, characterized in that the feedback path and the amplifier stage constitute a negative feedback loop and in that the amplitude-frequency response of the feedback path has a low-pass slope.

13. An audio amplifier arrangement as claimed in claim 12, characterized in that said filtering device comprises at least a first resistor which is arranged between the input and the output of the filtering device, a second resistor, a first terminal of which is coupled to said output and a second terminal of which is connected to a first terminal of a capacitor, a second terminal of said capacitor being coupled to ground, a third resistor which is arranged between the junction of the second resistor and the capacitor and a first terminal of a switching element, a fourth resistor which is arranged between the input and the first terminal of the switching element, a second terminal of the switching element being coupled to ground.

14. An audio amplifier arrangement as claimed in claim 1, characterized in that said filtering device comprises at least a first resistor which is arranged between the input and the output of the filtering device, a second resistor, a first terminal of which is coupled to said output and a second terminal of which is connected to a first terminal of a capacitor, a second terminal of said capacitor being coupled to ground, a third resistor which is arranged between the junction of the second resistor and the capacitor and a first terminal of a switching element, a fourth resistor which is arranged between the input and the first terminal of the switching element, a second terminal of the switching element being coupled to ground.

* * * * *